United States Patent [19]

Turner, Jr.

[11] 4,439,741

[45] Mar. 27, 1984

[54] STABILIZED HIGH EFFICIENCY RADIO FREQUENCY AMPLIFIER

[75] Inventor: Harvey N. Turner, Jr., Tamarac, Fla.

[73] Assignee: Motorola, Inc., Schaumburg, Ill.

[21] Appl. No.: 392,919

[22] Filed: Jun. 28, 1982

[51] Int. Cl.³ .............................................. H03F 1/26
[52] U.S. Cl. .................................... 330/149; 330/282;
330/284; 455/63
[58] Field of Search ................. 330/86, 110, 145, 149,
330/282, 286, 284, 298; 455/114, 117, 50, 63

[56] References Cited

U.S. PATENT DOCUMENTS

| | | | |
|---|---|---|---|
| 3,345,570 | 10/1967 | Matyckas | 330/298 X |
| 3,794,931 | 2/1974 | Albrecht et al. | |
| 3,801,922 | 4/1974 | Muszkiewicz | |
| 3,942,181 | 3/1976 | Berrod et al. | |
| 4,023,112 | 5/1977 | Dunker et al. | |
| 4,057,765 | 11/1977 | Schuermann | |
| 4,131,860 | 12/1978 | Fyot | 330/298 X |
| 4,147,985 | 4/1979 | Rogers | 455/117 X |
| 4,275,362 | 6/1981 | Harford | |
| 4,370,622 | 1/1983 | Hornbeck et al. | 455/117 X |

*Primary Examiner*—James B. Mullins
*Attorney, Agent, or Firm*—Mark P. Kahler; Edward M. Roney; James W. Gillman

[57] ABSTRACT

A high efficiency radio frequency amplifier is provided which includes stabilization circuitry which is selectively actuated during periods of time when undesired amplifier circuit operating conditions are present which tend to cause amplifier oscillation. Otherwise, the stabilization circuit remains in effect decoupled from the amplifier so as not to unnecessarily draw power from the amplifier circuit when its action is not required to prevent undesired oscillation of the amplifier.

7 Claims, 5 Drawing Figures

STABILIZED HIGH EFFICIENCY RADIO FREQUENCY AMPLIFIER

BACKGROUND OF THE INVENTION

This invention relates to radio frequency amplifiers and, more particularly to high efficiency radio frequency amplifiers which are stabilized against undesired oscillation.

DESCRIPTION OF THE PRIOR ART

A conventional unstabilized radio frequency amplifier is shown in FIG. 1. Such amplifier includes a radio frequency amplifier transistor 10 and associated inductor-capacitor input and output matching circuitry coupled thereto as clearly seen in the drawing and readily recognized by those skilled in the art. A power supply voltage $V_{DC}$ is provided to the collector of an amplifier transistor 10 via an inductor 20. The conventional unstabilized amplifier of FIG. 1 is capable of operating at an overall efficiency of approximately 80% when the input and output thereof are properly matched. However, if a mismatch is presented to the input or output of such amplifier, it will often become unstable and undesirably commence oscillation. One cause of such oscillation is the undesired feedback of signals from the output of the amplifier to the input of the amplifier. In summary, the amplifier of FIG. 1 is a very efficient but potentially unstable amplifier.

FIG. 2 shows a radio frequency amplifier substantially similar to the amplifier of FIG. 1 except for the inclusion of a stabilization circuit 30 (shown within the dashed lines) coupled to amplifier transistor 10 in the manner discussed subsequently. Stabilization circuit 30 includes a resistor 32 and a capacitor 34 coupled together in series to form a resistor-capacitor circuit which is coupled in parallel with the collector and the base of amplifier transistor 10. Stabilization circuit 30 further includes a resistor 36 coupled in parallel with the base and emitter of amplifier transistor 10. By providing the radio frequency amplifier of FIG. 2 with stabilization circuit 30, undesired feedback signals from the output (collector) of the amplifier transistor 10 to the input (base) of transistor 10 are dampened out. Thus, the undesired feedback signals which tend to cause such amplifier to oscillate are attenuated resulting in a stabilized radio frequency amplifier.

Unfortunately, although stabilization circuit 30 prevents oscillation, it does so in a relatively inefficient manner. More specifically, relatively large voltage swings of up to 40 volts, for example, across the aforementioned resistor 32 in stabilization circuit 30 may consume power in excess of one (1) watt. Such high power consumption reduces the overall efficiency of the amplifier of FIG. 2 to approximately 30%. This amplifier thus exhibits an efficiency so low as to be unacceptable for many portable radio applications. The reason for the large inefficiency of the amplifier of FIG. 2 is that the stabilization circuit 30 thereof consumes significant amounts of power at all times to stabilize the amplifier against undesired oscillations, that is, even when such stabilization is not necessary as is the case during times when the input and the output of the amplifier are properly matched.

One object of the present invention is to provide a radio frequency amplifier which exhibits high efficiency and which is stabilized against undesired oscillation during periods of time at which such amplifier is subjected to operating conditions which may tend to cause the amplifier to oscillate.

Another object of the present invention is to provide a high efficiency stabilized radio frequency amplifier which exhibits a relatively constant gain.

Yet another object of the present invention is to provide a stabilized high efficiency radio frequency amplifier which is suitable for portable radio applications.

These and other objects of the invention will become apparent to those skilled in the art upon consideration of the following description of the invention.

BRIEF SUMMARY OF THE INVENTION

The present invention is directed to providing a high efficiency radio frequency amplifier which is stabilized against the tendency of such amplifiers to oscillate.

In accordance with one embodiment of the invention, the radio frequency amplifier circuit includes an amplifier for amplifying radio frequency signals provided thereto. A sensing circuit is operatively coupled to the amplifier for generating a sense signal which indicates when the amplifier is subjected to undesired operating conditions tending to cause oscillation of the amplifier. The invention further includes a selectively actuable stabilization circuit which is operatively coupled to the sensing circuit and the amplifier. The stabilization circuit is operative in a first mode for stabilizing the amplifier during periods of time when the sense signal indicate that the amplifier is being subjected to the aforementioned undesired operating conditions. Otherwise, the stabilization circuit is operable in a second mode for permitting the operation of the amplifier to remain substantially uneffected when the sense signal indicates the absence of the aforementioned undesired operating conditions.

The features of the invention believed to be novel are set forth with particularity in the appended claims. The invention itself, however, both as to organization and method of operation, together with further objects and advantages thereof may best be understood by reference to the following description taken in conjunction with the accompanying drawings.

DETAILED DESCRIPTION OF THE PREFERRED EMBODIMENT

Figure 1:
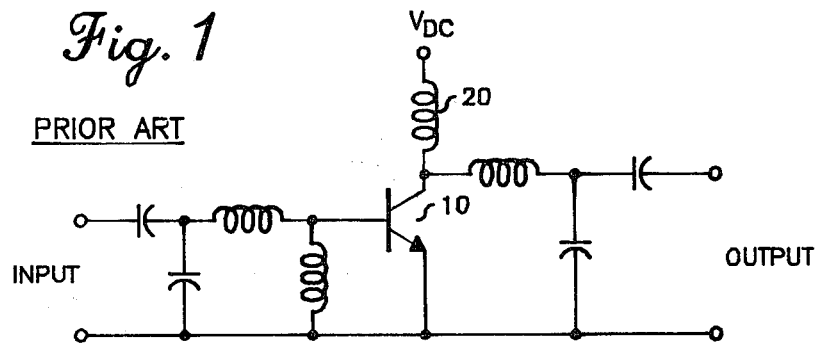
FIG. 1 is a schematic diagram of a conventional unstabilized high efficiency radio frequency amplifier.
Figure 2:
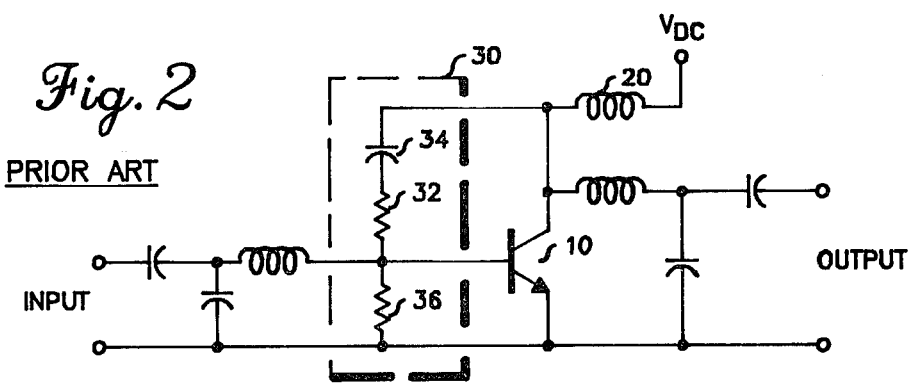
FIG. 2 is a schematic diagram of a conventional stabilized radio frequency amplifier which exhibits relatively low efficiency.
Figure 3:
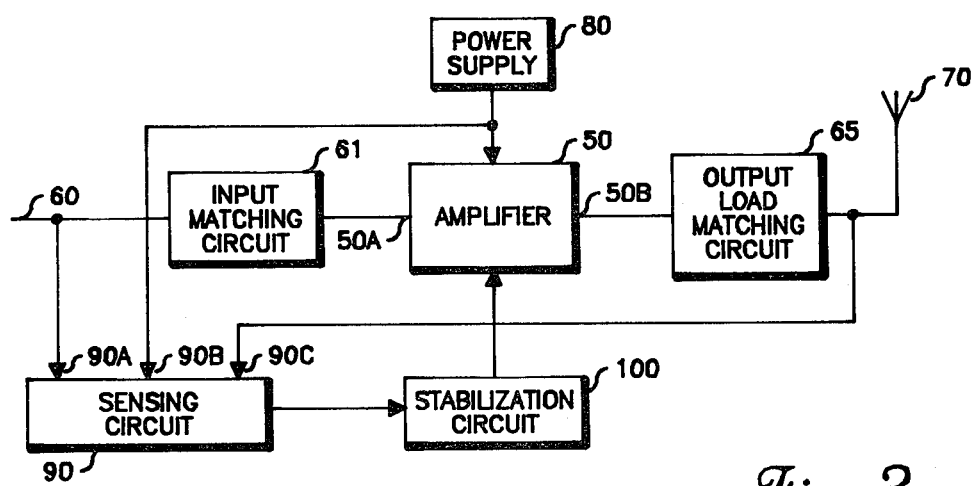
FIG. 3 is a block diagram of the stabilized high efficiency radio frequency amplifier of the present invention.

FIG. 3 illustrates a functional block diagram of one embodiment of the stabilized high efficiency radio frequency amplifier circuit of the present invention. The radio frequency amplifier circuit of FIG. 3 includes an amplifier 50 capable of increasing the amplitude of radio frequency signals provided to input 50A thereof and providing signals so amplified to output 50B thereof. Amplifier input 50A is coupled to a circuit input 60 via an appropriate input impedance matching circuit 61. Input line 60 is adapted to receive relatively low level radio frequency signals to be amplified by amplifier 50. The output 50B of amplifier 50 is coupled to an antenna 70 via an appropriate output impedance load matching circuit 65. A power supply 80 is operatively coupled to amplifier 50 to provide appropriate biasing voltage thereto.

The radio frequency amplifier circuit of FIG. 3 includes a sensing circuit 90 having three inputs 90A, 90B, and 90C in this embodiment. Sensing circuit 90 includes an output 90D at which a sense signal is generated whenever a condition tending to cause oscillation of amplifier 50 is detected by sensing circuit 90. More specifically, sensing circuit input 90A is operatively coupled to input 60 so as to monitor the input matching condition to which amplifier 50 is subjected. If the input matching conditions are at a particular moment in time are of the type which would tend to cause oscillation of amplifier 50, then sensing circuit 90 generates a sense signal at output 90D. A stabilization circuit 100 coupled between output 90D and amplifier 50 is actuated by such sense signal to cause amplifier 50 to be stabilized during any period of time for which sensing circuit 90 determines that an input mismatch exists via input 90A.

Sensing circuit input 90C is operatively coupled to the amplifier output 50B by an operative connection to antenna 70 such that signal information regarding mismatched conditions between amplifier output 50B and antenna 70 which would tend to cause amplifier oscillation are conveyed to sensing circuit 90. Sensing circuit 90 generates a sense signal at output 90D during any period of time for which a mismatched load condition is indicated between amplifier output 50B and antenna 70 via the signal information provided to input 90B. Thus, during any period of time when a mismatch between amplifier output 50B and antenna 70 exists which would tend to cause oscillation of amplifier 50, stabilization circuit 100 is actuated to prevent such oscillation of amplifier 50.

Sensing circuit input 90C is coupled to the output of power supply 80 such that if the voltage supplied to amplifier 50 should assume a value which would tend to cause oscillation of amplifier 50, sensing circuit 90 generates a sense signal at output 90D during the period of time for which amplifier 50 is subjected to such undesired oscillation causing voltage. Thus, again during any period of time at which amplifier 50 is subjected to such undesired operating voltage which might tend to cause oscillation, stabilization circuit 100 is actuated to stabilize amplifier 50 and thus prevent such oscillation.

It is thus seen that stabilization circuit 100 is actuated or operatively coupled to amplifier 50 to stabilize such amplifier only during the times when such amplifier is subjected to operating conditions tending to cause instability or oscillation, namely input mismatches, output mismatches, and power supply variations. (These operating conditions are designated as undesired or improper conditions.) During the periods of time at which amplifier 50 is not subjected to such undesired operating conditions, stabilization circuit 50 remains unactuated or effectively operatively decoupled from amplifier 50. Thus, selectively actuable stabilization circuit 100 draws power to stabilize amplifier 50 at the times when such stabilization is most needed. Otherwise, stabilization circuit 100 remains in what may be characterized as a "standby" condition. A significantly large amount of power is thus conserved because the power consuming stabilization circuit 100 is not always energized. A highly efficient stabilized radio frequency amplifier is thus achieved.

Figure 4:
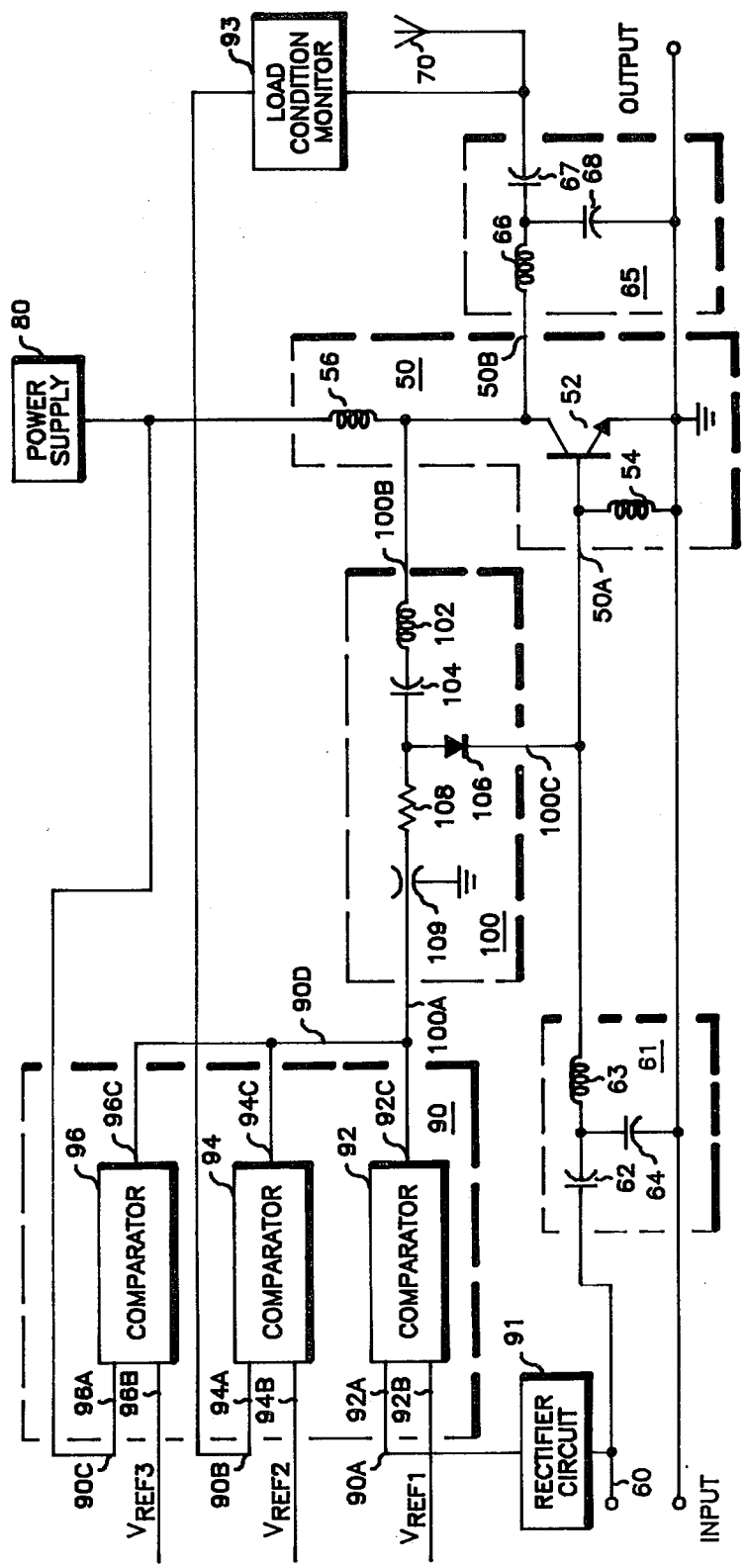
FIG. 4 is a more detailed representation of one embodiment of the stabilized high efficiency radio frequency amplifier of FIG. 3.

FIG. 4 shows one detailed representation of an embodiment of the invention shown generally in FIG. 3. In this particular embodiment, amplifier 50 (shown enclosed by a dashed line) includes a radio frequency amplifier transistor 52. Transistor 52 exhibits a frequency response appropriate to amplify signals at the desired operating frequency. The base of transistor 52 is designated as input 50A of amplifier 50. The collector of transistor 52 is designated as the output 50B of amplifier 50. The emitter of transistor 52 is electrically coupled to ground. Amplifier 50 includes an inductor 54 (a radio frequency choke, for example) electrically coupled between the base and the emitter of amplifier transistor 52. Amplifier 50 includes an inductor 56 coupled between the output of a direct current power supply 80 and the collector of transistor 52. Amplifier transistor 52 is thus provided with appropriate direct current bias voltages. Inductor 54 cooperates to appropriately bias transistor 52.

In this particular embodiment of the invention, the input matching circuit 61 (shown enclosed by a dashed line) coupled between circuit input 60 and amplifier input 50A includes a capacitor 62 and an inductor 63 connected together in series between circuit input 60 and amplifier input 50A. The node thus formed between capacitor 62 and inductor 63 is coupled to ground via a capacitor 64. This combination of elements in input matching circuit 61 serves to impedance match radio frequency signals provided from circuit input 60 to amplifier input 50A.

In this particular embodiment of the invention, output load matching circuit 65 (shown enclosed by a dashed line), which is coupled between amplifier output 50B and antenna 70, includes an inductor 66 and a capacitor 67 coupled together in series between amplifier output 50B and antenna 70. A capacitor 68 is coupled between ground and the node formed between inductor 66 and capacitor 67. The amplified radio frequency signal generated at amplifier output 50B is thus appropriately impedance matched to the load, namely antenna 70, via output load matching circuit 65.

One sensing circuit which may be employed as sensing circuit 90 to sense undesired amplifier circuit operating conditions tending to cause oscillation of amplifier 50 is shown in FIG. 4 within the dashed lined box designated 90. Such sensing circuit 90 senses undesired input matching conditions occuring at circuit input 60, undesired load conditions occuring at antenna 70 and undesired power supply operating conditions occuring at power supply 80, all of which may tend to cause amplifier 50 to undesirably oscillate. When any one or more of such undesired operating conditions are detected by sensing circuit 90, circuit 90 generates an appropriate sense signal at output 90D.

More specifically, to determine whether an undesired input matching condition occurs which is likely to cause oscillation of amplifier 50, sensing circuit 90 includes a rectifier circuit 91, the input of which is coupled to circuit input 60 so as to convert input radio frequency signals to a direct current voltage level signal. The amplitude of such direct current voltage signals provides an indication of whether proper matching is occuring at input 60 at any particular point in time.

The output of rectifier circuit 91 is coupled via sensing circuit input 90A to an input 92A of a comparator 92. Comparator 92 further includes an input 92B to which an appropriate threshold reference voltage $V_{REF1}$ is supplied. The amplitude of voltage $V_{REF1}$ is determined such that during periods of time when an undesired matching condition exists at circuit input 60, the rectified voltage generated by rectifier circuit 91 and supplied to comparator input 92A is less than the threshold reference voltage $V_{REF1}$ supplied to comparator input 92B, thus indicating drive failure and causing comparator 92 to generate a sense signal at its output 92C. Comparator output 92C is electrically coupled to sensing circuit output 90D such that any sense signals indicating improper input matching conditions appear at sensing circuit output 90D.

Sensing circuit 90 also determines whether undesired operating conditions such as a load impedance mismatch exist at the load (antenna 70) of the amplifier of FIG. 4. During the periods of times at which such mismatched load conditions exist which tend to undesirably cause amplifier 50 to oscillate, sensing circuit 90 generates a sense signal at sensing circuit output 90D. To accomplish this purpose, sensing circuit 90 includes a load condition monitor 93, for example a voltage standing wave ratio (VSWR) bridge, coupled between antenna 70 and sensing circuit input 90B. Sensing circuit 90B is coupled to an input 94A of a comparator 94 such that a voltage signal exhibiting an amplitude proportional to the power reflected from antenna 70 is provided to comparator input 94A. A reference voltage level signal $V_{REF2}$ is supplied to a reference input 94B of comparator 94. Signal $V_{REF2}$ exhibits an appropriate predetermined amplitude such that during periods of time when mismatched load conditions exist, the reflected power signal reaching comparator input 94A exceeds the threshold level $V_{REF2}$ provided to comparator input 94B thus causing comparator 94 to generate a sense signal at comparator output 94C. Comparator output 94C is coupled to sensing circuit output 90D such that during periods of time when improper mismatched load conditions tending to cause oscillation of amplifier 50 exist at antenna 70 and associated output circuitry, the sense signal generated at comparator output 94C is provided to sensing circuit output 90D.

Sensing circuit 90 also generates a sense signal at sensing circuit output 90D during periods of time when the voltage supplied by power supply 80 to amplifier 50 changes to an improper value which would tend to cause amplifier 50 to oscillate. For example, should the voltage supplied by power supply 80 fall below a certain level, amplifier 50 may tend to oscillate. To provide for this eventuality, the output of power supply 80 is coupled to sensing circuit input 90C which is coupled to an input 96A of a comparator 96. A reference voltage $V_{REF3}$ is supplied to a reference voltage input 96B of comparator 96. Signal $V_{REF3}$ exhibits an appropriate predetermined amplitude such that during periods of time when improper power supply voltage exists which tend to cause oscillation of amplifier 50, the power supply voltage reaching comparator input 96A falls below the threshold level $V_{REF3}$ thus causing comparator 96 to generate a sense signal at its output 96C. Comparator output 96C is coupled to sensing circuit output 90D such that during periods of time when the voltage supplied by power supply 80 falls below a predetermined level which would tend to cause amplifier 50 to oscillate a sense signal is provided to sensing circuit output 90D.

It is understood that under certain conditions, should the voltage supplied by power supply 80 to amplifier 50 rise above a certain predetermined threshold level, amplifier 50 may tend to oscillate. A comparator circuit similar to comparator 96, except employing a different reference voltage appropriate for determining when the power supply voltage of supply 80 exceeds a level tending to cause oscillation may be employed to detect such an undesired operating condition. In such case, a sense signal is generated at sensing circuit output 90D during periods of time when the power supply voltage of supply 80 exceeds a predetermined level tending to cause amplifier oscillation.

Typical amplifier circuits which may be employed as comparators 92, 94, and 96 are the model number MC3303 and MC3503 manufactured by Motorola, Inc.

The amplifier circuit of FIG. 4 includes a selectively actuable stabilization circuit 100 coupled in the feedback path between the collector of amplifier transistor 52 to the base of amplifier transistor 52 so as to dampen out undesired feedback signals tending to cause oscillation of amplifier 50 during periods of time at which improper input matching conditions, improper output matching conditions or improper power supply voltage variations are present as indicated by the generation of a sense signal at sensing circuit output 90D.

More specifically, stabilization circuit 100 includes an inductor 102, a capacitor 104 and a PIN diode 106 all coupled together in series between the collector and base of amplifier transistor 52. As seen in FIG. 4, the end of inductor 102 coupled to the collector of transistor 52 is designated terminal 100B. The anode of PIN diode 106 is coupled to capacitor 104. The cathode of PIN diode 106 is designated terminal 100C and is coupled to the base of amplifier transistor 52. The anode of PIN diode 106 is coupled via a resistor 108 to a stabilization circuit actuation terminal 100A. A feedthrough capacitor 109 couples stabilization circuit actuation terminal 100A to ground for radio frequency signal bypassing purposes.

Sensing circuit output 90D is coupled to stabilization circuit actuation terminal 100A such that whenever a sense signal is generated at sensing circuit output 90D, stabilization circuit 100 is actuated to provide damping in the feedback path between the collector and the base of amplifier transistor 52. More specifically, whenever a sense signal is generated by sensing circuit 90 so as to indicate potentially unstable (improper) operating conditions, such sense signal is provided via resistor 108 to PIN diode 106 which is turned on to exhibit a sufficiently low resistance so as to in effect couple the damping circuit formed by inductor 102 and capacitor 104 and the radio frequency resistance of PIN diode 106 between the collector and base of amplifier 52. Thus, the stabilization circuit 100 is actuated at appropriate times to dampen undesired feedback signals between the collector and base of amplifier transistor 52.

However, when sensing circuit 90 has found no improper operating conditions in the circuit of FIG. 4 which would tend to cause oscillation, no sense signal is provided to stabilization circuit 100 and PIN diode 106 therein. Thus, when operating conditions are proper, PIN diode 106 biased off to exhibit a sufficiently high impedance to in effect decouple the damping circuit formed by inductor 102 and capacitor 104 from connection between the collector and base of amplifier transistor 52.

In summary, stabilization circuit 100 is actuated when improper operating conditions are detected which tend to cause oscillation. Stabilization circuit 100 remains unactuated when such undesired improper operating conditions are not detected.

Figure 5:
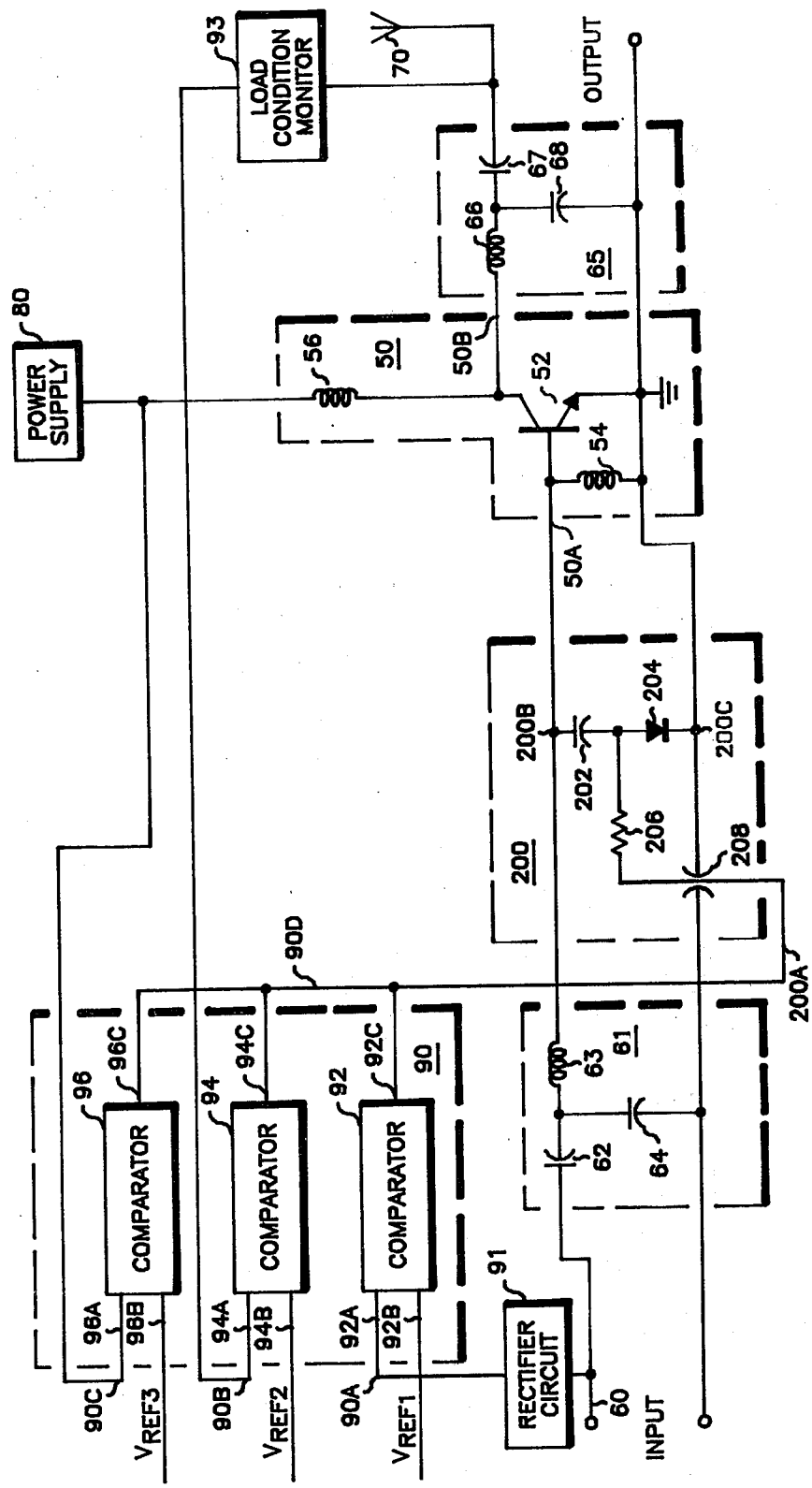
FIG. 5 is a more detailed representation of another embodiment of the stabilized high efficiency radio frequency amplifier of FIG. 3

FIG. 5 shows another embodiment of the stabilized high efficiency radio frequency amplifier of the present invention. The circuit shown in FIG. 5 is substantially the same as the circuit illustrated in FIG. 4 except for the location of the selectively actuable stabilization circuit which in this embodiment is designated selectively actuable stabilization circuit 200 due to its different location and configuration. Like numbers indicate like elements in FIGS. 4 and 5. The circuit of FIG. 4 deals with the feedback path existing between the collector and the base of amplifier transistor 52. It is recognized however that other feedback paths exist which may tend to cause amplifier 52 to oscillate. For example, if one or more of the aforementioned improper input matching conditions, improper output load matching conditions or improper power supply voltage conditions are present, the feedback path existing between the base and the emitter of transistor 52 is often significant and requires stabilization.

Stabilization circuit 200 includes a stabilization circuit actuation terminal 200A which is coupled to sensing circuit output 90D. Stabilization circuit 200 further includes terminals 200B and 200C between which a capacitor 202 and a PIN diode 204 are coupled in series. Stabilization circuit terminals 200B and 200C are coupled to the base and the emitter of amplifier transistor 52, respectively. Stabilization circuit actuation terminal 200A is coupled via a resistor 206 to the node formed between the anode of PIN diode 204 and capacitor 202 coupled thereto. The anode of PIN diode 204 is coupled to the terminal of capacitor 202 not coupled to the base of transistor 52 and the cathode of PIN diode 204 is coupled to the ground. As shown in FIG. 5, a feedthrough capacitor 208 is provided to the line coupling resistor 206 and stabilization circuit actuation terminal 200A as such line crosses ground line 210 for radio frequency signal bypassing purposes.

It is seen that when a sense signal indicating any of the aforementioned improper amplifier circuit operating conditions tending to cause oscillation is provided to actuation terminal 200A, such sense signal is coupled via a resistor 206 to PIN diode 204. When such sense signal is thus present, PIN diode 204 is biased on to exhibit a sufficiently low resistance as to in effect cause capacitor 202 and the radio frequency resistance of PIN diode 204 to be coupled between the base and emitter of transistor 52 such that undesired feedback signals between such base and emitter are dampened. However, when sensing circuit 90 indicates that none of the aforementioned improper circuit operating conditions tending to cause oscillation are present, no sense signal is generated and provided to actuation terminal 200A. Thus, PIN diode 204 remains biased off and capacitor 202 is effectively decoupled from connection between the base and emitter feedback path of transistor 52. Operation of amplifier 52 thus remains substantially unaffected by stabilization circuit 200 when no sense signal is generated by sensing circuit 90.

Significant power is consumed by stabilization circuit 200 during the times when improper operating conditions are sensed and not during the times when improper operating conditions tending to cause oscillation are not present. The aforementioned improper operating conditions are typically present for relatively short periods of time and thus the periods of times during which the stabilization circuit 200 (or stabilization circuit 100 of FIG. 4) is actuated and consumes power is correspondingly limited and relatively small. Thus, the overall efficiency of the amplifiers of FIG. 4 and FIG. 5 is quite high.

It is noted that in some applications, it is desirable to employ both stabilization circuit 100 between the collector and base of amplifier transistor, and stabilization circuit 200 coupled between the base and emitter of amplifier transistor 52.

In the course of the above description of the apparatus for stabilizing a radio frequency amplifier, a method is described for achieving such purpose. The method for stabilizing a radio frequency amplifier includes the steps of generating a signal which indicates when the amplifier is being subjected to undesired (improper) operating conditions tending to cause oscillation. Such method further includes coupling a stabilization circuit to the amplifier to stabilize the amplifier during periods of time when the sense signal indicates that the amplifier is being subjected to the undesired operating conditions. The method further includes decoupling the stabilization circuit from the amplifier during periods of time when the sense signal indicates that the amplifier is not being subjected to the undesired operating conditions.

The foregoing describes an apparatus and method for achieving a high efficiency radio frequency amplifier which is stabilized against operating conditions tending to cause undesired oscillation of the amplifier. Such amplifier consumes reduced amounts of power and thus may be employed advantageously in low power portable radio transmitters.

While only certain preferred features of the invention have been shown by way of illustration, many modifications and changes will occur to those skilled in the art. It is, therefore, to be understood that the present claims are intended to cover all such modifications and changes as fall within the true spirit of the invention.

What is claimed is:

1. A radio frequency amplifier circuit comprising:
    amplification means for amplifying radio frequency signals provided thereto, said amplification means having undesired feedback paths associated therewith;
    sensing means, operatively coupled to said amplification means, for generating a sense signal which indicates when said amplification means is subjected to undesired operating conditions tending to cause oscillation of said amplification means;
    stabilization circuit means, operatively coupled to said sensing means, for stabilizing said amplification means by dampening signals in said undesired feedback paths associated with said amplification means, said stabilization circuit means including at least one stabilization element, and
    coupling means, coupled to said sensing means, for coupling said stabilization circuit means to said amplification means during periods of time when said sense signal indicates that said amplification means is being subjected to said undesired operating conditions and for decoupling said stabilization circuit means from said amplification means during periods of time when said sense signal indicates that said amplification means is not being subjected to said undesired operating conditions, such that said stabilization circuit means dampens signals in said undesired feedback paths and dissipates substantial RF power only during periods of time when said stabilization circuit means is coupled to said amplification means by said coupling means.

2. The radio frequency amplifier of claim 1 wherein said sensing means includes means for generating said sense signal indicating when the output of said amplification means is mismatched.

3. The radio frequency amplifier of claim 1 wherein said sensing means includes means for generating said sense signal indicating when the input of said amplification means is mismatched.

4. The radio frequency amplifier of claim 1 wherein said sensing means includes means for generating said sense signal indicating when a voltage supplied to power said amplification means deviates from desired voltage values which permits stable operation of said amplification means.

5. The radio frequency amplifier of claim 1 wherein said stabilization circuit means comprises an impedance circuit.

6. The radio frequency amplifier of claim 5 wherein said impedance circuit comprises an inductor-capacitor circuit.

7. A method for stabilizing a radio frequency amplifier having undesired feedback paths associated therewith comprising the steps of:
  generating a sense signal which indicates when said amplifier is being subjected to new undesired operating conditions tending to cause oscillation;
  selectively coupling a stabilization circuit to said amplifier to stabilize said amplifier by dampening signals in said undesired feedback paths during periods of time when said sense signal indicates that said amplifier is being subjected to undesired operating conditions, and
  selectively decoupling said stabilization circuit from said amplifier during periods of time when said sense signal indicates that said amplifier is not being subject to said undesired operating conditions.

* * * * *